US005602050A

United States Patent [19]

Sudo

[11] Patent Number: 5,602,050
[45] Date of Patent: Feb. 11, 1997

[54] METHOD OF MAKING A SEMICONDUCTOR DEVICE WITH CONDUCTORS ON STEPPED SUBSTRATE HAVING PLANAR UPPER SURFACES

[75] Inventor: Akira Sudo, Yokohama, Japan

[73] Assignee: Kabushiki Kaisha Toshiba, Japan

[21] Appl. No.: 396,799

[22] Filed: Mar. 1, 1995

Related U.S. Application Data

[62] Division of Ser. No. 226,338, Apr. 12, 1994, Pat. No. 5,420,462.

[30] Foreign Application Priority Data

| Apr. 13, 1993 | [JP] | Japan | 5-086084 |
| Apr. 6, 1994 | [JP] | Japan | 6-086365 |

[51] Int. Cl.$^6$ .......................... H01L 21/265; H01L 21/70; H01L 27/00; H01L 21/465
[52] U.S. Cl. .............................. 437/52; 437/60; 437/225; 437/228
[58] Field of Search ..................................... 437/979, 980, 437/60, 52, 917, 225, 228, 40 R, 41 R; 156/636.1

[56] References Cited

U.S. PATENT DOCUMENTS

| 4,713,356 | 12/1987 | Hiruta | 437/231 |
| 4,879,257 | 11/1989 | Patrick | 257/752 |
| 5,026,666 | 6/1991 | Hills et al. | 437/228 |
| 5,081,065 | 1/1992 | Jonkers et al. | 437/228 |
| 5,135,881 | 8/1992 | Saeki | 437/60 |
| 5,200,635 | 4/1993 | Kaga et al. | 257/308 |
| 5,218,219 | 6/1993 | Ajika et al. | 257/752 |
| 5,252,516 | 10/1993 | Nguyen et al. | 437/979 |
| 5,256,892 | 10/1993 | Yoshida | 257/306 |
| 5,290,728 | 3/1994 | Sato | 437/60 |
| 5,346,587 | 9/1994 | Doan et al. | 437/192 |
| 5,411,909 | 5/1995 | Manning et al. | 437/52 |
| 5,422,289 | 6/1995 | Pierce | 437/32 |

*Primary Examiner*—Mary Wilczewski
*Assistant Examiner*—Brian K. Dutton
*Attorney, Agent, or Firm*—Banner & Witcoff, Ltd.

[57] ABSTRACT

An element separating oxide film is formed on a P-type semiconductor substrate by means of a selective oxidation method, and then a gate oxide film is formed on the element separating oxide film by a thermal oxidation method. A gate electrode film made of an N-type polysilicon material is formed so as to extend along a step portion of the element separating oxide film on the semiconductor substrate. The upper surface of the gate electrode film is flattened by means of a surface polishing method. Then, isotropic etching is performed by using a resist pattern as a mask, thereby forming a gate electrode. Since in the method the upper surface of the gate electrode film in the flattened, the semiconductor substrate is prevented from being subject to over-etching when a gage electrode is formed, so that the changes of characteristics of MOS transistors are prevented whose gate insulative films have been becoming thinner as their elements have been finer.

8 Claims, 8 Drawing Sheets

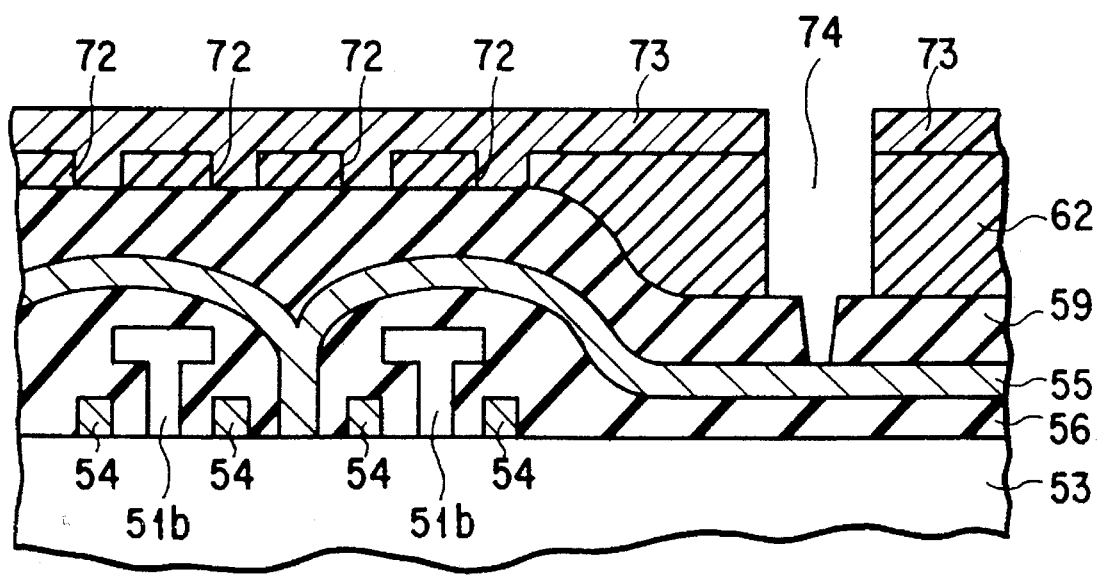
F I G. 9D
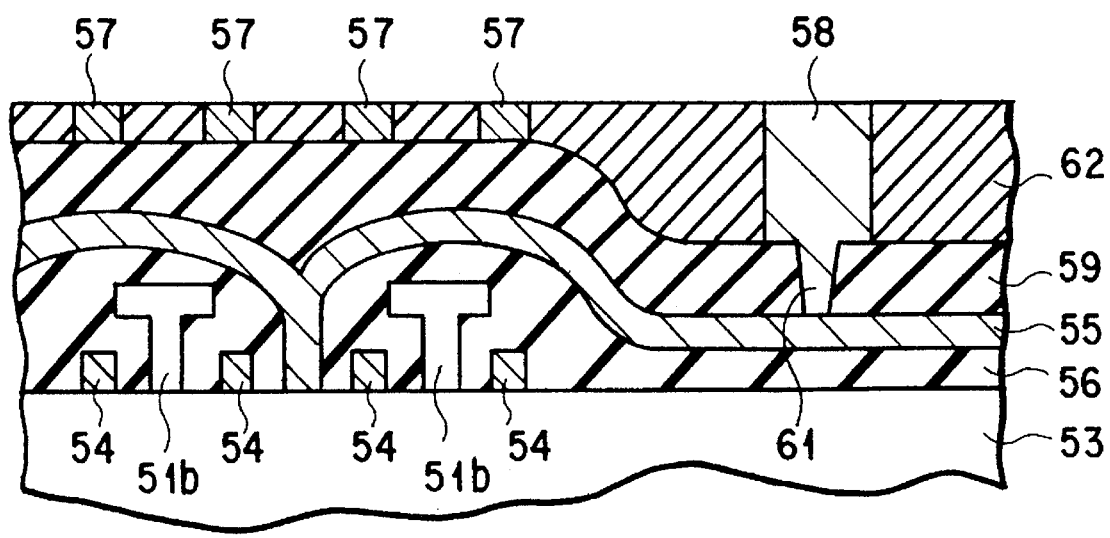
F I G. 9E

METHOD OF MAKING A SEMICONDUCTOR DEVICE WITH CONDUCTORS ON STEPPED SUBSTRATE HAVING PLANAR UPPER SURFACES

This application is a division of application Ser. No. 08/226,338, filed Apr. 12, 1994, now U.S. Pat. No. 5,420,462.

BACKGROUND OF THE INVENTION

1. Field of the Invention

The present invention relates to a semiconductor device provided with a step portion on a semiconductor substrate and a method of manufacturing the same, in particular, to a MOS transistor, a DRAM of a stack structure and the like and a method of manufacturing the same.

2. Description of the Related Art

As the structure of the LSI element has become finer, the gate insulting film of the MOS transistor has become thinner.

In she conventional MOS transistor, a gate electrode is formed by patterning a gate electrode film formed on a gate insulative film.

FIGS. 1A to 1D are general views of a conventional manufacturing process of a general MOS transistor, particularly, a process for processing a gate electrode.

As shown in FIG. 1A, an element separating region 101 and a gaze insulative film 102 are formed on a semiconductor substrate 100. Then, a conductive film 103 is formed on the whole element separating region 101 and the whole gate insulative film 102 by means of an appropriate process such as a CVD process, as shown in FIG. 1B.

Thereafter, a resist pattern 104 is formed on the conductive film 103 by a resist coating and lithography process, as shown in FIG. 1C. The conductive film 103 is etched isotropically to form a gate electrode 105, and a metal wiring 107, using the resist pattern 104 as a mask, as shown in FIG. 1D.

However, the element separating region 101 has a step portion S, as shown in FIG. 1B. Thus, the thickness of the step portion S of the conductive film 103 is larger than the other portions, i.e., the flat portions of the conductive film 103.

Upon performing isotropic etching on a conductive film for forming a gate electrode, the etching time is selected so that the thickest portion of the conductive film 103, i.e., the step portion S of the conductive film 103 can be removed during this etching time. On the other hand, this etching time is too long to be required for removing the flat portions of the conductive film 103.

As shown in FIG. 1D, therefore, an over-etching occurs at that region of the flat portions of the conductive film 103 not masked by the resist pattern 104 and depressions 106 are formed in the substrate 100. Thus, the characteristics of the element as a MOS transistor have come to differ greatly from the designed characteristics.

This phenomenon has appeared as the gate insulative film has become thinner by making the element finer and this quick countermeasures for reducing this phenomenon has been required.

In the above-mentioned conventional MOS transistor, metal wirings (a conductive film) 107 are formed on the element separating region 101 simultaneously with formation of the gate electrode 105.

with this formation method, the upper surface of the gate electrode 105 is not flush with the metal wirings 107. When, for example, a multi-level wiring is formed, it is hard to flatten the surfaces of an inter-level film, making it difficult to pattern the upper-level wiring film.

Even if the flattering can be made easily, differences of the depths of contacts connected to the upper-level wiring film from place to place make formation of contact holes difficult. That is, the conventional method has a difficulty in making of open holes and embedding contacts.

In order to optimize the device characteristics of a DRAM (Dynamic RAM) having a stack structure, it is demanded, on one hand, that the thickness of the metal wirings, for example, be reduced at the memory cells so as to reduce a capacitance between the wirings, and it is required, on the other hand, that the thickness of metal wirings be increased at the peripheral circuit portion so as to reduce a resistance thereby to cause a large current to flow and so as to improve reliability.

In the general conventional DRAM, the metal wirings have a single thickness, and thus, it was impossible to form wirings having such thicknesses as satisfy these two contradictory requirements.

For solving this problem, there has recently been made a proposal which can change the thickness of metal wirings partially, as disclosed in Japanese Patent Kokai Publication 4-10455, for example.

Although, however, the film thickness can be changed partially with this proposal, the upper surfaces of the metal wirings are not in the same plane. Similarly to the above-mentioned MOS transistor, therefore, it is difficult to flatten the surfaces of the inter-level film when, for example, a multi-level wiring is formed.

Even if the flattering can be made easily, differences of the depths of contacts connected to the upper-level wiring film from place to place make formation of contact holes difficult.

As described above, the phenomenon has appeared as the gate insulative film has become thinner by making the element finer and this quick countermeasures for reducing this phenomenon has been required.

Further, since the upper surfaces of the gate electrode and the metal wiring are not in the same plane in the conventional semiconductor, it is difficult to pattern the upper-level wiring film and to form contact holes.

SUMMARY OF THE INVENTION

An object of the present invention is to provide a semiconductor device which is manufactured without increasing the number of processes unnecessarily and in which the semiconductor substrate is easily protected from being etched and the characteristics of the element are easily prevented from being changed, and also to provide a method of manufacturing the semiconductor device.

Another object of the present invention is to provide a semiconductor device which has a partial step portion and in which the upper surface of a conductive film provided on a step portion and the upper surface of a conductive film provided on a non-stepped portion extend flush with each other in a plane at the same level, although the thickness of the conductive film is changed.

In order to achieve the objects, a semiconductor device according to the present invention comprises a semiconductor substrate; a step portion on the semiconductor substrate, a first conductive film on the step portion, having an upper surface; a second conductive film on the semiconductor substrate, having an upper surface; and the upper surface of the first conductive film and the upper surface of the second conductive film being flush with each other.

Another aspect of a semiconductor device according to the present invention comprises a semiconductor substrate, a step portion on the semiconductor substrate; a conductive film on the semiconductor substrate; another conductive film on the step portion, and the conductive films being made from a conductive layer having a flattened upper surface.

An aspect of a method of manufacturing a semiconductor device according to the present invention comprises a step of forming a step portion on a semiconductor substrate; a step of forming a conductive layer over the semiconductor substrate and the step portion a step of flattening an upper surface of the conductive layer; and a step of patterning the conductive layer which has been flattened to form a conductive film on the semiconductor substrate and another conductive film on the step portion.

Another aspect of a method of manufacturing a semiconductor device according to the present invention comprises a step of forming an element separating region on a semiconductor substrate to provide a step portion on the semiconductor substrate; a step of forming a gate insulating film of a MOS transistor on the semiconductor substrate; a step of forming a conductive layer over the semiconductor substrate and the gate insulating film; a step of polishing and flattening an upper surface of the conductive layer; and a step of patterning the flattened conductive layer to form a gate electrode on the semiconductor substrate.

A further aspect of a method of manufacturing a semiconductor device according to the present invention comprises: a step of forming a memory cell array region on a semiconductor substrate to provide a step portion on the semiconductor substrate; a step of forming an insulating film along the step portion over the semiconductor substrate and the memory cell array region; a step of depositing a conductive layer along the step portion over the insulating film; a step of polishing and flattening an upper surface of the conductive layer; and a step of patterning the flattened conductive film to form a wiring for shunting memory word lines on the memory cell array region.

A still another aspect of a method of manufacturing a semiconductor device according to the present invention comprises a step of forming a memory cell array region on a semiconductor substrate to form a step portion on the semiconductor substrate; a step of forming an insulating film along the step portion over the semiconductor substrate; a step of depositing a conductive film along the step portion on the insulating film; a step of polishing ant flattening an upper surface of the conductive film; and a step of patterning the flattened conductive film to form a wiring for shunting memory word lines on the memory cell array area and a wiring for a memory peripheral circuit on the semiconductor substrate.

A still further aspect of a method of manufacturing a semiconductor device according to the present invention comprises a step of forming a step portion on a semiconductor substrate; a step of forming an insulating film along the step portion over the semiconductor substrate; a step of polishing and flattening an upper surface of the insulating film; a step of forming two or more grooves having different depths in the flattened surface of the insulating film; a step of depositing a conductive film on the insulating film in which the grooves are formed; and a step of polishing an upper surface of the conductive film to remove those portions of the conductive film which are other than those portions corresponding to the grooves thereby forming conductors in the grooves.

A yet another aspect of a method of manufacturing a semiconductor device according to the present invention comprises a step of forming a memory cell array region on a semiconductor substrate to provide a step portion on the semiconductor substrate; a step of forming an insulating film along the step over the semiconductor substrate; a step of polishing and flattening an upper surface of the insulating film; a step of forming two or more grooves having different depths from each other in the flattened surface of the insulating film; a step of depositing a conductive film on the insulating film; and a step of polishing an upper surface of the conductive film to remove those portions of the conductive film which are other than those portions corresponding to the grooves thereby forming conductive layers in the grooves.

A yet further aspect of a method of manufacturing a semiconductor device according to the present invention comprises a step of forming a memory cell array region on the semiconductor substrate to provide a step portion on the semiconductor substrate; a step of forming an insulating film along the step portion over the semiconductor substrate; a step of polishing and flattening an upper surface of the insulating film; a step of forming first grooves in the flattened upper surface of the insulating film; a step of forming second grooves, which have different depth from the first grooves, in the upper surface of the insulating surface; a step of depositing a conductive film over the insulating film in which the first and second grooves having different depths from each other are formed; and a step of polishing an upper surface of the conductive film to remove those portions of the conductive film other than those portions corresponding to the grooves thereby forming conductive layers in the grooves, and wherein the first grooves are formed at the step portion so as to receive a wiring for shunting memory word lines and the second grooves are formed at a portion of the semiconductor substrate which is other than the step portion so as to receive a wiring for the memory peripheral circuit.

Another aspect of a method of manufacturing a semiconductor device according to the present invention comprises a step of forming a memory cell array region on a semiconductor substrate to provide a step portion on the semiconductor substrate; a step of forming an insulating film along the step portion over the semiconductor substrate; a step of polishing and flattening an upper surface of the insulating film; a step of forming first grooves in part of a surface of the flattened insulating film on the step portion; a step of depositing a conductive film in which the first grooves are formed; a step of polishing a surface of the conductive film to form a wiring for shunting memory word lines in the first grooves; a step of forming second grooves having depth different from the first grooves in a surface of part of the semiconductor substrate other than the step portion; a step of depositing a conductive layer on the insulating film in which the second grooves are formed; and a step of polishing a surface of the conductive layer deposited on the insulating film to form a wiring for a memory peripheral circuit in the second grooves.

Since the upper surface of the conductive film formed on the substrate becomes a plane by the above-mentioned means, the to-be-etched region of the conductive layer can be completely etched without an over-etching to the substrate.

Since the upper surfaces of the conductive films can be made flush with each other by the above-mentioned means with the present invention, upper-level wiring film can be patterned and contact holes can be made easily when multi-level wirings are formed by changing the thicknesses of the conductive films partially.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9A to 9E show general process of manufacturing a DRAM according to a fifth embodiment of the present invention;

DETAILED DESCRIPTION OF THE PREFERRED EMBODIMENTS

Figure 1A:
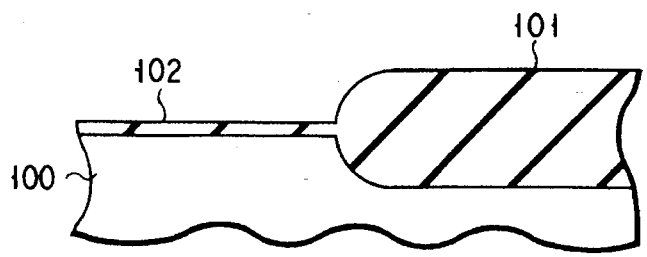
FIGS. 1A to 1D show general steps of manufacturing a conventional MOS transistor.
Figure 1B:
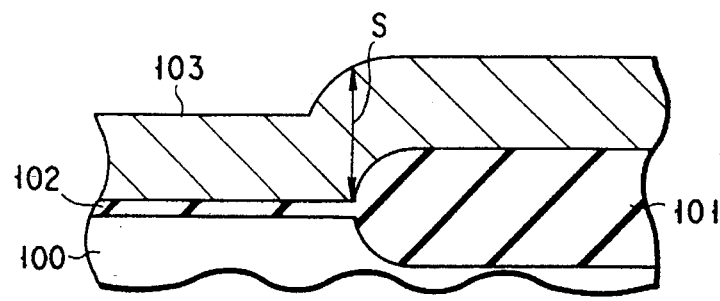
Figure 1C:
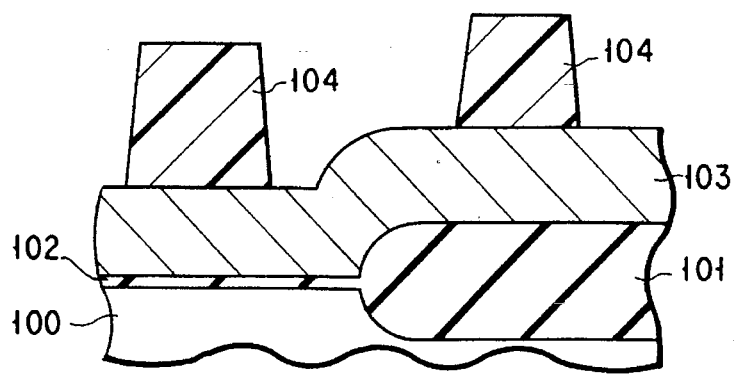
Figure 1D:
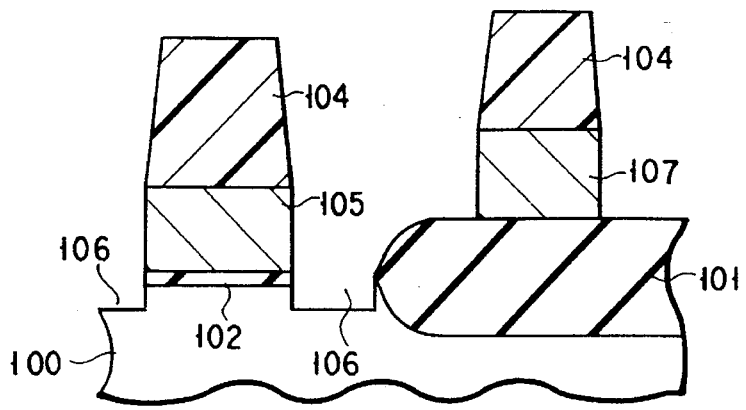
Figure 2:
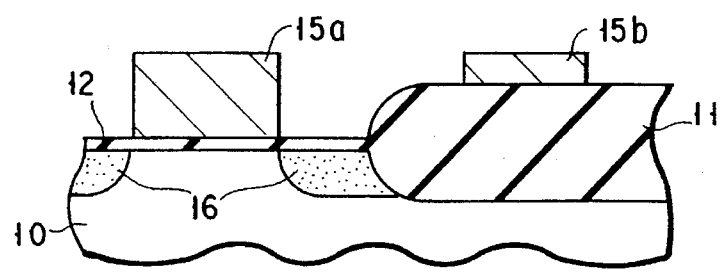
FIG. 2 is a general cross-sectional view of the structure of a MOS transistor according to a first embodiment of the present invention.

FIG. 2 is a general cross-sectional view of a MOS transistor according to a first embodiment of the present invention.

The MOS transistor comprises an element separating oxide film or element separating film 11 formed by means of a selective oxidation method on a P type semiconductor substrate 10 to have a step portion on the substrate, a gate oxide film or a gate insulative film 12 formed by a thermal oxidation method, a gate electrode 15a and a metal wiring 15b formed by isotropic etching by using a mask of a resist pattern (not shown) after the upper surface of a gate electrode film made of an N-type polysilicon material formed by a CVD method has been flattened by a surface polishing method to form a smooth plane at the same level, and an impurity diffusion region 16 including a source and a drain formed by injecting impurity such as phosphor.

In the embodiment, a conductive film is patterned to form the gate electrode 15a and a metal wiring 15b, after the upper surface of the conductive film has been flattened.

A method of manufacturing a MOS transistor according to the first embodiment of the present invention will be described.

FIGS. 3A to 3E show general manufacturing processes of manufacturing the MOS transistor.

Figure 3A:
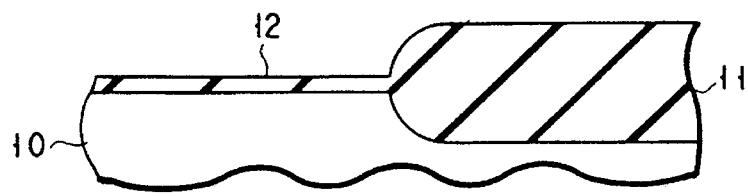
FIGS. 3A to 3E show general processes of manufacturing the MOS transistor of FIG. 2.

After an element separating oxide film 11 having a step portion has been formed on a P-type semiconductor substrate 10 by a selective oxidation method, a gate oxide film 12 is formed by a thermal oxidation method (FIG. 3A).

Figure 3B:
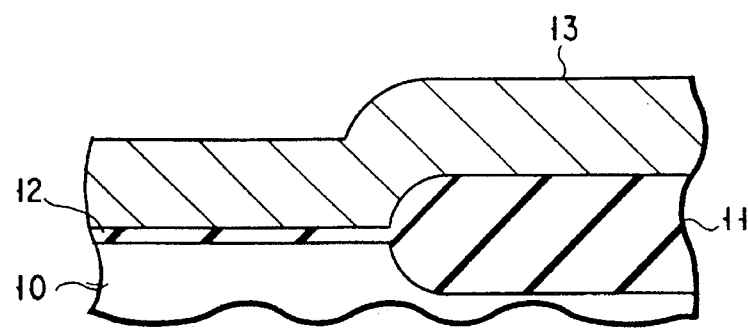

Then, a conductive film 13 made of an N-type polysilicon material for forming the gate electrode 15a and the metal wiring 15b is formed over the substrate 10 by a CVD method or the like (FIG. 3B).

Figure 3C:
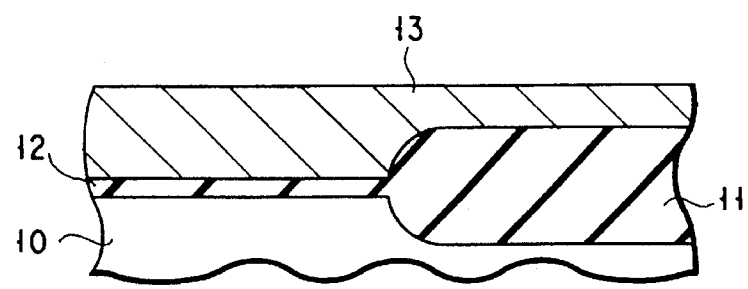

The thickness of the conductive film 13 formed on the substrate 10 is gradually reduced by a removing method such as a surface polishing method until the step portion of the conductive film is removed so that the upper surface of the conductive film 13 is flattened (FIG. 3C).

Since the upper surface of the conductive film 13 is flattened until the step portion does not exist thereon, the portion of the conductive film 13 on which there was the step portion becomes as thick as or less than a predetermined value, i.e., the thickness of the flat portions of the conductive film 13.

Figure 3D:
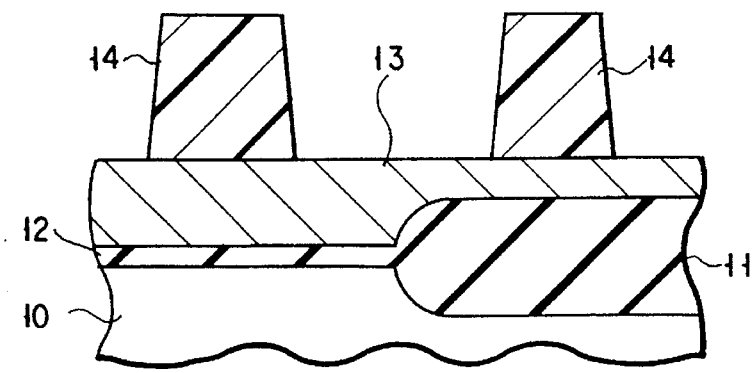

Thereafter, a resist pattern 14 is formed at a predetermined position by a resist-coating and lithographic technique (FIG. 3D). Then, the resist pattern 14 is used as a mask and isotropic etching is carried out on the conductive film 13 to form a gate electrode 15a and metal wiring 15b.

In this case, the element separating oxide film 11 together with the conductive film 13 is removed a little. However, the removed amount of the portion of the film 11 is very small due to the difference of the etching rates between the element separating oxide film 11 and the conductive film 13. As the element separating oxide film 11 is very thick, it does not affect the characteristics of the element.

In this case, the etching time is set to the time required for removing the conductive film 13 formed on the gate oxide film 12. In consequence, a gate electrode 15a can be formed without causing an over etching which accompanies removal of the gate oxide film 12 and the formation of depressions in the substrate 10 (FIG. 3E).

Figure 3E:
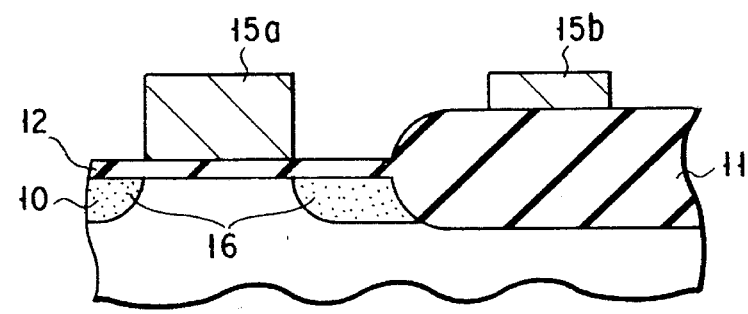

The resist pattern 14 is removed, and thereafter the gate electrode 15a and the element separating oxide film 11 are used as mask, and impurity such as phosphor is ion-implanted into the substrate 10 to form diffusion regions 16, thereby obtaining a MOS transistor as shown in FIGS. 2 and 3E.

In a multi-level wiring having lower wirings comprising the gate electrode 15a and the metal wiring 15b which are formed in the above-mentioned MOS transistor, an upper-level wiring (not shown) is formed after an inter-level insulating film (not shown) has been deposited, the surfaces of the inter-level insulating film have been flattened and contact holes (not shown) have been formed.

In this case, the upper surfaces of the gate electrode 15a and the metal wiring 15b are at the same level. Thus, not only the surfaces of the inter-level insulating film can be flattened easily, but also the depths of the contacts connected to the upper-level wiring can be made equal. Thus, patterning of the upper-level wiring and formation of the contact holes can be performed easily.

A second embodiment of the present invention will be described with reference to FIGS. 4A to 4E which show general manufacturing processes of a MOS transistor of the second embodiment.

Figure 4A:
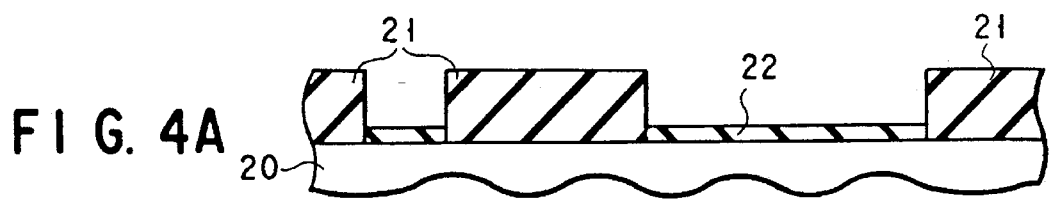
FIGS. 4A to 4E show general processes of manufacturing a MOS transistor according to a second embodiment of the present invention.

A silicon nitride film 21 acting as an element separating oxide film is selectively formed on a P type semiconductor substrate 20. The silicon nitride film 21 is made by forming a silicon nitride layer by a CVD method and by isotropically etching the silicon nitride layer using a mask not shown (FIG. 4A).

Figure 4B:
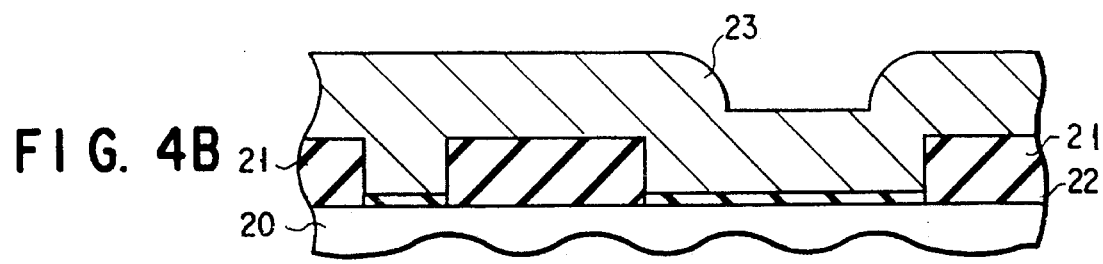
Figure 4C:
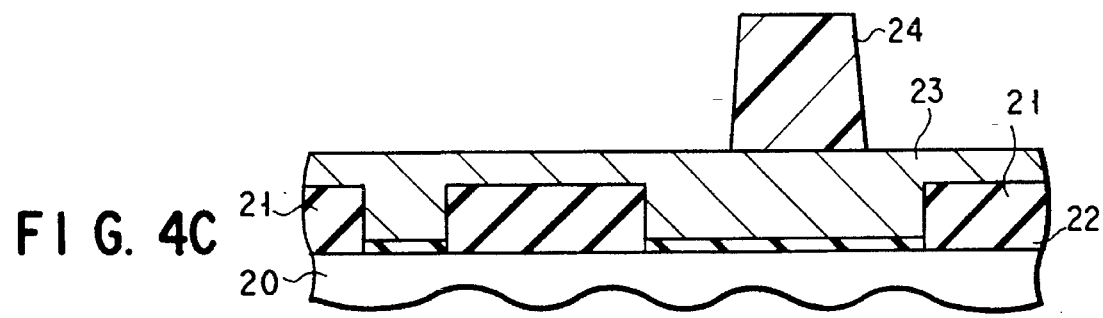

Then, a gate oxide film 22 is formed on the substrate 20 by a thermal oxidation method (FIG. 4B).

Thereafter, a conductive film 23 made of an N-type polysilicon material is formed on the gate oxide film 22 by means of a CVD method (FIG. 4B).

Similarly to the first embodiment, the upper surface of the conductive film 23 is flattened by means of a surface polishing method or the like, so that the upper surface of the conductive film 23 is maintained at the same level in height.

Figure 4D:
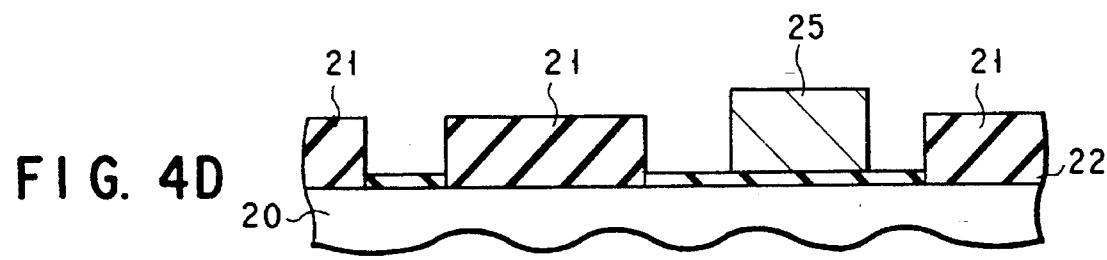

After this process, a resist pattern 24 is formed at the predetermined position on the conductive film 23. Then, using the resist pattern 24 as a mask, the isotropic etching is performed on the conductive film 23 to form a gate electrode 25, as shown in FIG. 4D.

Figure 4E:
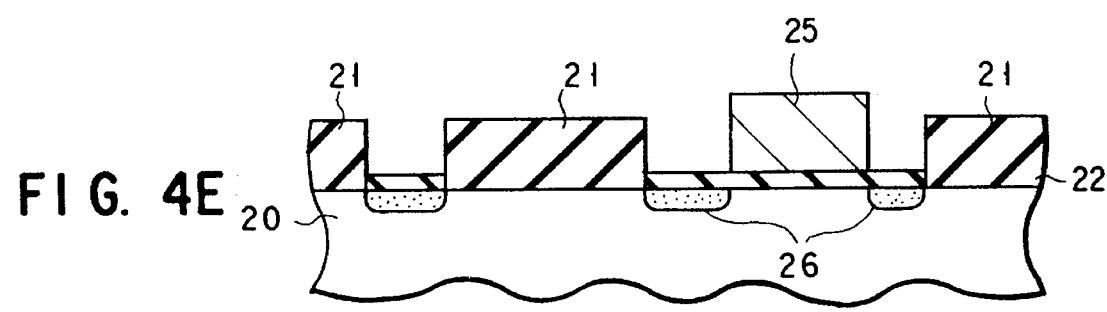

Finally, the resist pattern 24 is removed, and thereafter the silicon nitride film 21 and the gate electrode 25 are used as masks and impurity such as phosphor is implanted into the substrate to form an impurity diffusion region 26. As a result, a MOS transistor is obtained (FIG. 4E).

The gate electrode 25 is not limited to the one made of a single metal film such as an N-type polysilicon film as is in this embodiment but is applicable to a MOS transistor comprising a plurality (two, for example) of metal gate electrodes.

FIGS. 5A to 5E show a third embodiment of a method of manufacturing a MOS transistor according to the present invention, wherein the MOS transistor has a gate electrode structure 25 comprising a gate electrode film 23 made of an N-type polysilicon material and a metal silicide film 31 such as a Ti film.

Figure 5A:
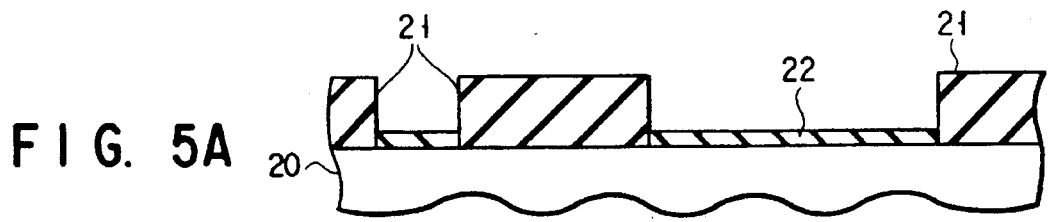
FIGS. 5A to 5E show general processes of manufacturing a MOS transistor according to a third embodiment of the present invention.
Figure 5B:
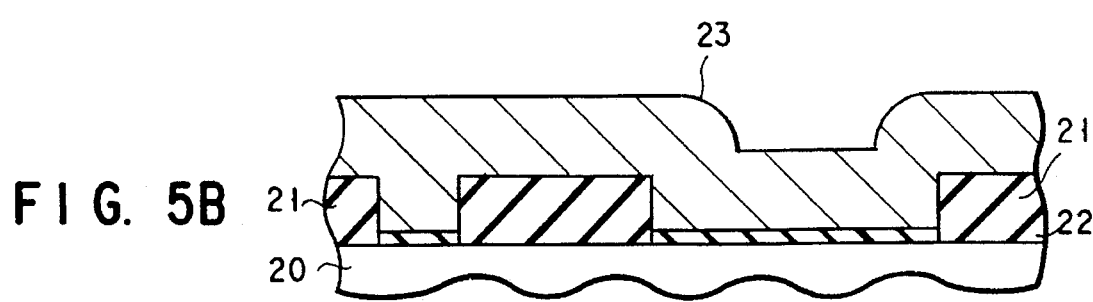
Figure 5C:
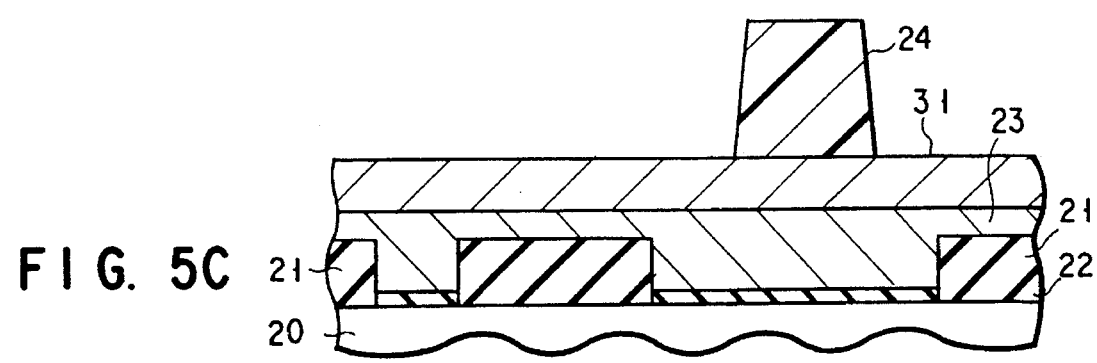
Figure 5D:
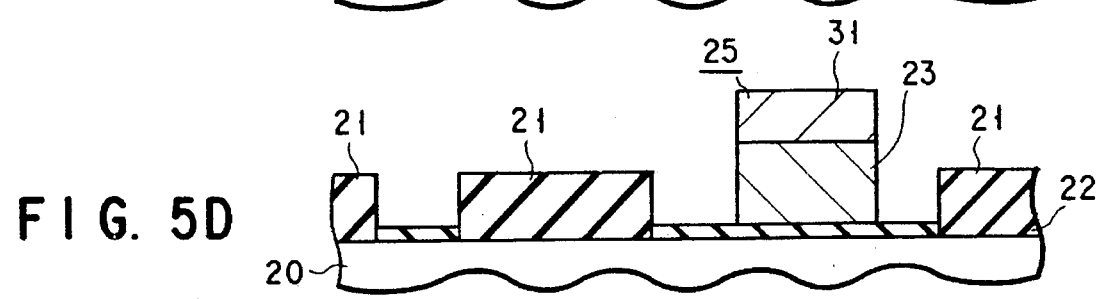
Figure 5E:
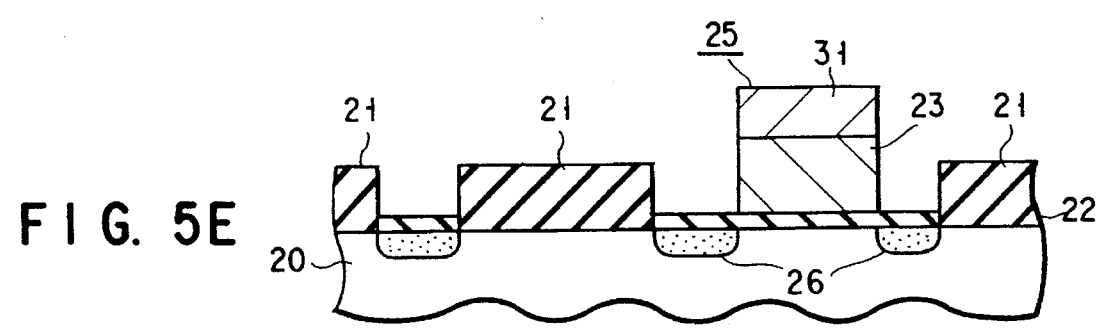

In this case, too, a conductive film 23 is formed on a substrate 20 on which silicon nitride films 21 are selectively formed (FIG. 5A), as shown in FIG. 5B. The upper surface of the conductive film 23 is flattened, and a silicide film 31 is formed of the conductive film 23. Thereafter, a resist pattern 24 is formed on a predetermined position on the silicide film 31 (FIG. 5C). Isotropic etching is processed on the silicide film 31 and the conductive film 23 by using the resist pattern 24 as a mask. Thus, a gate electrode 25 comprising two metal films is manufactured. After this, the resist pattern 24 is removed, and thereafter impurity such as phosphor is ion-implanted by using the silicon nitride film 21 and the gate electrode 25 as masks to form an impurity diffusion region 26 including a source and a drain, thereby fabricating a MOS transistor.

In this embodiment, the step portion of the conductive film 23 is removed prior to the patterning of the gate electrode 25. Thus, the etching time can be set to the time required for removing the flat portions of the conductive film, or can be set to a value less than this.

As described above, the embodiments can prevent overetching which adversely removes the gate insulative film and forms depressions in the substrate, merely by adding a single flatting step.

Further, since the upper surface of the gate electrode film is flattened by polishing before etching, the etching time is reduced by the time for removing the polished-away portion of the gate electrode film, as compared with the conventional case in which the polished-away portion is removed by etching.

Although the gate electrode and the wirings have different thicknesses from each other, their upper surfaces can be made flush with each other. Thus, patterning of the upper-level wiring and the holes for the contacts connected to the upper-level wirings can be achieved easily.

In the above-mentioned embodiments, the surface of the gate electrode film is flattened by polishing the surface. However, the present invention is not limited thereto. For example, a resist pattern may be formed on a predetermined position on a gate electrode film, and selective etching may be performed by using the resist pattern as a mask. In this case, however, it takes a longer time to flatten the conductive film.

Figure 6:
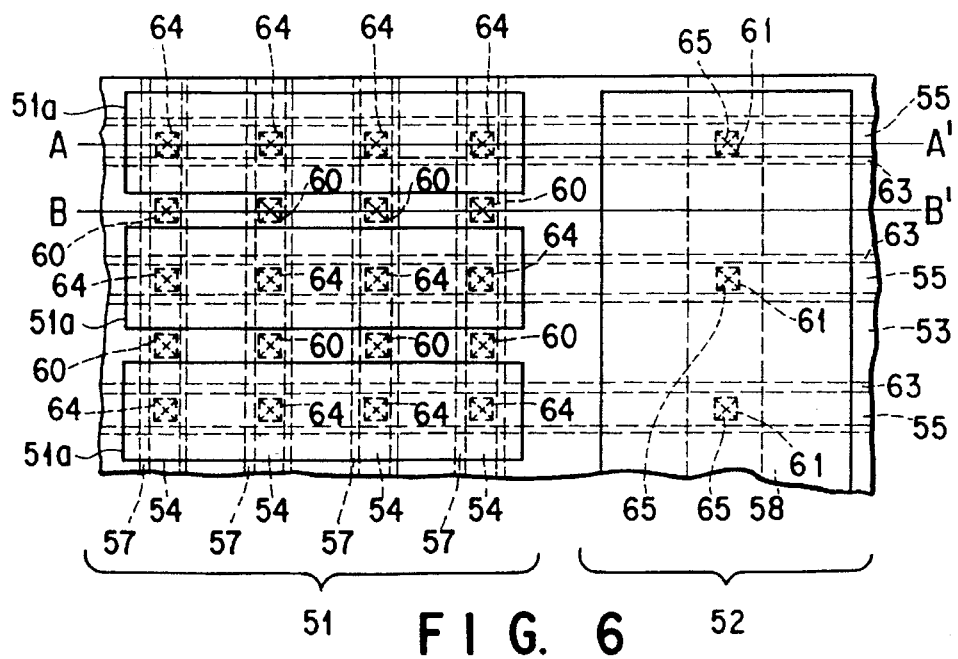
FIG. 6 is a general plan view of a DRAM according to a fourth embodiment of the present invention.
Figure 7A:
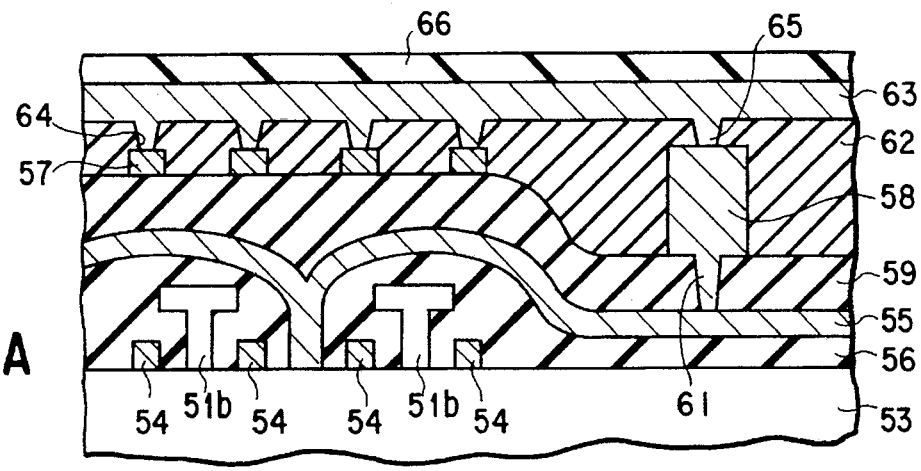
FIGS. 7A and 7B are cross sectional views along lines A—A' and B—B' of FIG. 6, respectively.
Figure 7B:
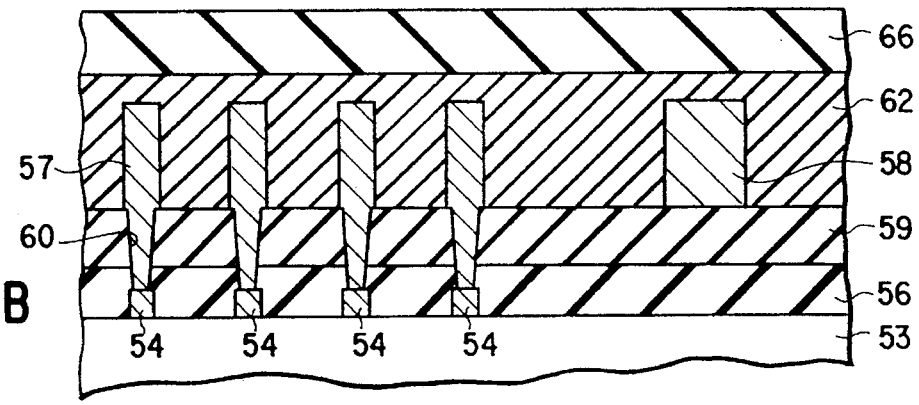

FIG. 6 is a general plan view of a DRAM having a stack structure according to a fourth embodiment of the present invention. FIG. 7A is a cross-sectional view along line A—A' of FIG. 6. FIG. 7B is a cross-sectional view along line B—B' of FIG. 6.

The DRAM includes a plurality of units each comprising a memory cell portion 51 and a peripheral circuit portion 52 so that memory cell portions 51 and the peripheral circuit portions 52 are arranged alternately. In FIGS. 6, 7A and 7B, only a single unit is shown for convenience.

The memory cell portion 51 comprises a plurality of memory cell array regions 51a, for example. Each memory array region 51a is formed by integrating capacitors 51b for several cells and switching MOS transistors (not shown).

In the memory cell portion 51, a plurality of word lines 54 made of polysilicone cross the corresponding memory cell array region 51a.

To the memory cell 51 is connected a plurality of bit lines 55 extending from the peripheral circuit portion 52 and crossing the respective memory cell array region 51a.

To the intersecting point of each word line 51 and each bit line 55 is connected a MOS transistor for switching each cell in the memory cell array portion 51a.

In other words, each memory cell comprises a switching transistor and a capacitor 51b connected to the transistor. Each gate is connected to the respective word line 54 and a drain is connected to the respective bit line 55. A source is connected to ground potential through the respective capacitor 51b.

Each peripheral circuit portion 52 includes a row/column decoder for selectively turning on and off the respective MOS transistor for switching a cell and an input-output amplifying circuit (neither shown).

Upon reading out data, the word line 54 is set at a high voltage by the row decoder and the bit line 55 is set at a high voltage by the column decoder.

Then, the MOS transistors for switching all cells connected to the word lines 54 and the bit lines 54 both set at the high voltage are turned on. Current flows between the drains and the sources of the MOS transistors for switching the cells connected to both the word lines 54 and bit lines 55 set at the high voltage.

In this way, data memorized in these cells, i.e., charges in the capacitors 51b are read out through the input-output amplifying circuit.

Data entry is carried out similarly.

In a DRAM having such a stack type structure, provision of the capacitors 51b and the like allow each memory cell array region 51a of the respective memory cell portion 51 to be made thick as compared with other portions (for example, peripheral circuit portions) and to provide a stepped portion.

Dioxide silicone films 56 are provided between the capacitors 51b, the word lines 54 and the bit lines 55.

Over each memory cell 51 through the dioxide silicon film 59 is provided a shunting metal wiring (conductor) 57 for reducing the wire resistance of the respective word line 54. Over each peripheral circuit portion 52 through the dioxide silicone film 59 is provided a metal wiring (conductor) 58 connected to the respective bit line 55.

The thickness of the dioxide silicon film 59 is, for example, 4,000 angstroms or more.

Each shunting metal wiring 57 is connected to the respective word line 54 through contact holes 60 formed in the dioxide silicon films 56 and 59 between the memory cell array regions 51a of the memory cell portion 51, for example.

Each metal wiring 58 is connected to the bit line 55 through a contact hole 61 formed in the dioxide silicon film 59 in the peripheral circuit portion 52, for example.

After having flattened the upper surface formed by uniformly depositing a conductive layer made of such as aluminum having a smaller wire resistance than polysilicone forming the word line 54, for example, by polishing it by means of a surface polishing method, the metal wirings 57 and 58 are formed by an anisotropic etching method using a later-described resist as a mask.

In this case, after having been processed so that the upper surfaces of the conductive films are flush with each other, the metal wirings 57 and 58 are patterned. The thickness of the metal wiring 57 for shunting the word lines 54 of the memory cell portion 51 is thinner by the step formed on the unprocessed metal wiring than that of the metal wiring 58.

This arrangement is beneficial when the wiring capacitance of the metal wiring 57 for shunting the word line 54 of the memory cell portion 51 is considered.

On the other hand, each metal wiring 58 in the peripheral circuit portion 52 is naturally thicker by the above-mentioned step due to the fact that there is no step portion there. This is very desirable to reduce the resistance for creating large current flow and to improve reliability.

An upper-level wiring film 63 forming a multi-level wiring along the corresponding bit line 55 is provided on the upper-level film of the memory cell portion 51 and the peripheral circuit portion 52 through an interlevel insulating film 62.

The upper-level wiring film 63 is formed by patterning aluminum, for example, after the surface of the inter-level insulating wiring 63 has been flattened. Then, the wiring 63 is connected to the respective contact hole 64 of the metal wiring 57 for shunting the word line 54 in each memory cell array region 51a of the memory cell portion 51 and is also connected to the metal wiring 58 through the contact hole 65 in the peripheral circuit portion.

In other words, holes for the contacts connected to the upper-level wiring film 63 are formed on the flattened inter-level insulating layer 62. Thereafter, aluminum, for example, is uniformly deposited and patterned into a predetermined shape by an anisotropic etching using a resist as a mask. In this way, the contact holes 64 and 65 and the upper film wiring 63 are formed.

Since the metal wirings 57 and 58 are previously processed so that their upper surfaces are in the same plane, flattening of the surface of the inter-level insulating film 62 is facilitated.

The depths of the metal wirings 57 and 58 are made equal so that the contact holes 64 and 65 can be formed easily.

A passivation film 66 is formed on the uppermost portions of the memory cell portion 51 and the peripheral circuit portion 52 so as to protect the surface of the element.

The manufacturing method of the above-mentioned DRAM will be described.

FIGS. 8A to 8D show general processes of manufacturing a DRAM according to the fourth embodiment as shown in FIGS. 6, 7A and 7B. The description will be made in view of the cross-sectional view along A—A' line of FIG. 6.

Figure 8A:
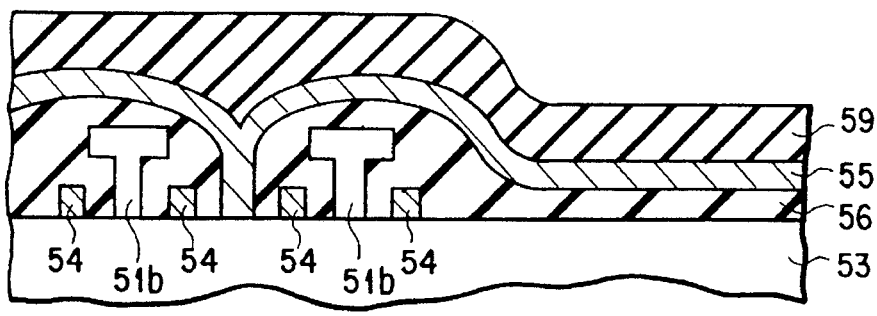
FIGS. 8A to 8D show general processes of manufacturing the DRAM according to the fourth embodiment of the present invention as shown in FIGS. 6, 7A and 7B.

After, for example, cells (each comprising a capacitor 51b and a MOS transistor (not shown)) in the region of each memory cell array region 51a of the memory cell portion 5, the peripheral circuit portions 52, the word lines 54, the dioxide silicon films 56, the bit lines 55 and the like have been formed on a semiconductor substrate 53 to provide a step portion on the semiconductor substrate 53, the dioxide silicon film 59 is formed over the semiconductor structure (FIG. 8A).

Figure 8B:
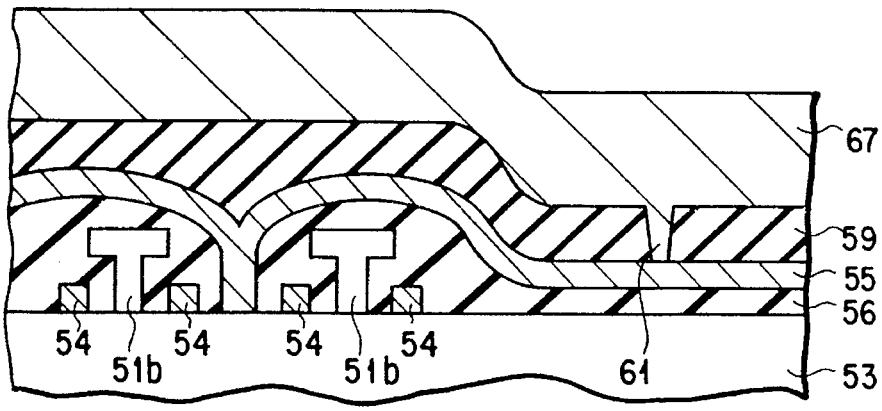

Following this process, the holes 61 (FIG. 6) for the contacts connected to the lines 55 are formed in the dioxide silicon film 59 of the peripheral circuit portion 52. The holes 60 (FIG. 6) for the contacts connected to the word lines 54 are similarly formed between the memory cell array region 51a. Thereafter, the conductive film 67 made of material such as aluminum having a smaller wire resistance than that of polysilicone is deposited uniformly on the dioxide silicon film 59 (FIG. 8B).

In this case, the conductive film 67 is formed by, for example, spattering a metal material such as aluminum so that the holes 60 and 61 are embedded by the spattered material to form contacts in the holes 60 and 61. The conductive film 67 is processed to form the metal wiring 57 for shunting word lines 54 of the memory cell portion 51 and the metal wiring 58 of the peripheral circuit portion 52. However, the conductive film 67 has a step portion on the memory cell portion 51 due to the stepped-up configuration of the memory cell portion.

Figure 8C:
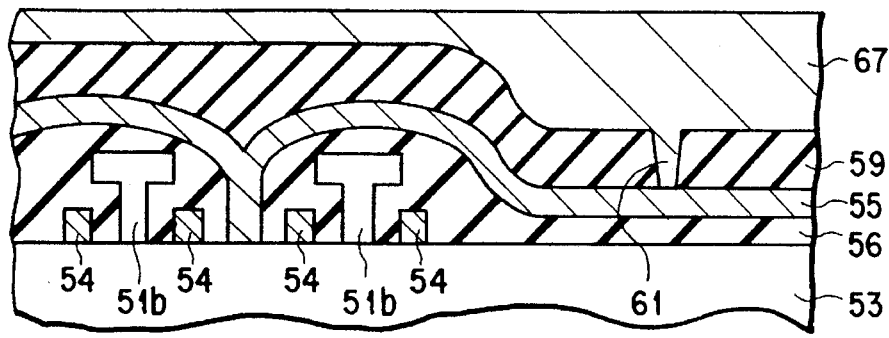

To remove the step configuration of the conductive film 67, the surface of the conductive film 67 deposited on the dioxide silicon film 59 is gradually removed by, for example, a surface polishing method so as to have a flattened surface (FIG. 8C).

With this process, the thickness of the entire conductive film 67 just before patterning the metal wirings 57 and 58 in all regions on the substrate 53 can be made equal to or less than the thickness of the actually deposited conductive film 67.

Therefore, the metal wirings 57 and 58 can be formed easily by setting the time required for removing the amount of the metal wiring by anisotropic etching (which is carried out at a later time) to the time required for fully removing the thickness of the conductive film 67 at the peripheral circuit portion 52.

Since the dioxide silicon film 59 is formed very thick in this embodiment, an over-etching to the dioxide silicon film 59 will not occur.

The dioxide silicon film 59 on the memory cell portion 51 is removed slightly. However, the etching rates of the conductive film 67 and the dioxide silicon film 59 differ from each other. Thus, the amount of removal of the film 59 is very little and does not effect the characteristics of the element.

The thickness of the conductive film 67 can be locally changed by previously flattening its upper surface.

For example, the film thickness of the conductive film 67 on the memory cell portion 51 can be made thin on one hand, and the film thickness of the conductive film 67 on the peripheral circuit portion 52 can be made thick on the other hand.

As a result, the metal wirings 57 and 58 which have different thicknesses at the memory cell portion 51 and the peripheral circuit portion 52, respectively, can be formed at a later time.

Figure 8D:
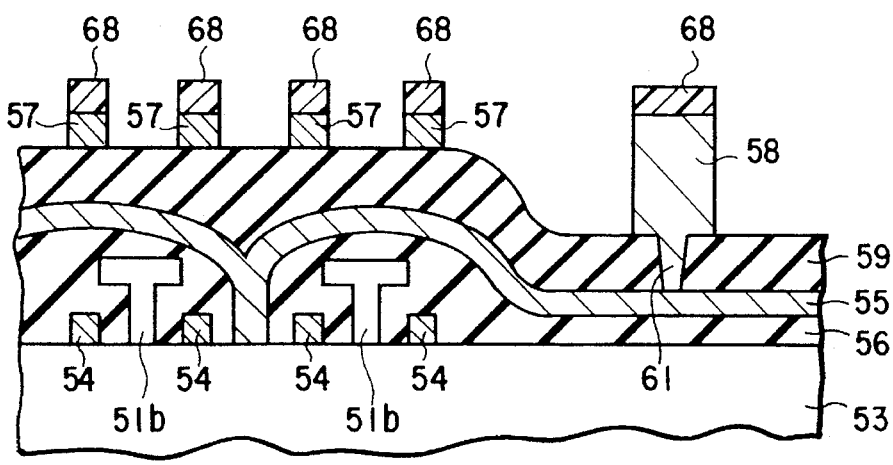

Thereafter, a resist film 68 is patterned by lithography and anisotropic etching is performed using the resist film 68 as a mask (FIG. 8D).

In this way, a thinner shunting metal wiring 57 than the metal wiring 58 at the peripheral circuit portion 52 is formed at the memory cell portion 51, and a thicker metal wiring 58 than the shunting metal wire 57 at the memory cell portion 51 is formed at the peripheral circuit portion 52.

After removal of the resist film 68, there are performed deposition and flattening of the inter-layer insulating film 62, formation of openings for contacts connected to the upper-level wiring film 63, formation of contact holes 64 and 65 due to deposition of metallic material, patterning of the upper-level wiring film 63, formation of the passivation film 66 and the like, thereby manufacturing a DRAM as shown in FIGS. 6, 7A and 7B.

As the upper surfaces of the metal wirings 57 and 58 are flush with each other in this case, the surface of the inter-level insulating layer 62 is flattened easily and the depths of the contacts connected to the upper-level wiring film 63 can be made equal. Thus, the upper-level wiring film 63 can be patterned easily and the contact holes 64 and 65 can be formed easily.

As described above, in the fourth embodiment, the upper surface of the conductive film is flattened previously so as to form a plane. Patterning of the upper-level wiring film and formation of the contact holes can be carried out easily with the thicknesses of the metal wires locally varied to form a multi-level wiring.

In other words, although the thickness of the conductive film at the memory cell portion and the thickness of the conductive film at the peripheral circuit portion are varied, the upper surfaces of the conductive films are made flush with each other. Thus, the surfaces of the inter-layer insulating film on the metal wirings can be flattened easily and the depths of the contacts connected to the upper-level wiring can be made equal so as to facilitate patterning of the upper-level wiring film and formation of the contact holes.

In addition, both a thin metal wiring for reducing the wiring resistance and a thick metal wiring for improving reliability can be formed, thereby obtaining optimum device characteristics.

In particular, this process is extremely beneficial for the DRAM of a stack structure in which the height of capacitors increases more and more as the DRAM are integrated more and more highly.

The method of making the upper surface of the metal wirings flush with each other is not limited to the method of polishing the surfaces of the conductive films but may be attained by embedding the metal wirings, for example.

The method of making the upper surfaces of the metal wirings by embedding the metal wirings will be described.

FIGS. 9A to 9E show general processes of manufacturing a DRAM according to a fifth embodiment in view of the cross section along line A—A' of FIG. 6.

Stepwisely formed on a semiconductor substrate 53 are cells (each comprising a capacitor 51b and a MOS transistor (not shown)) at each memory cell array area 51a of the memory cell portion 51, a peripheral circuit portion 52, word lines 94, a dioxide silicon film 56 and bit lines 55, for example. Then, a dioxide silicon film 59 is formed.

Figure 9A:
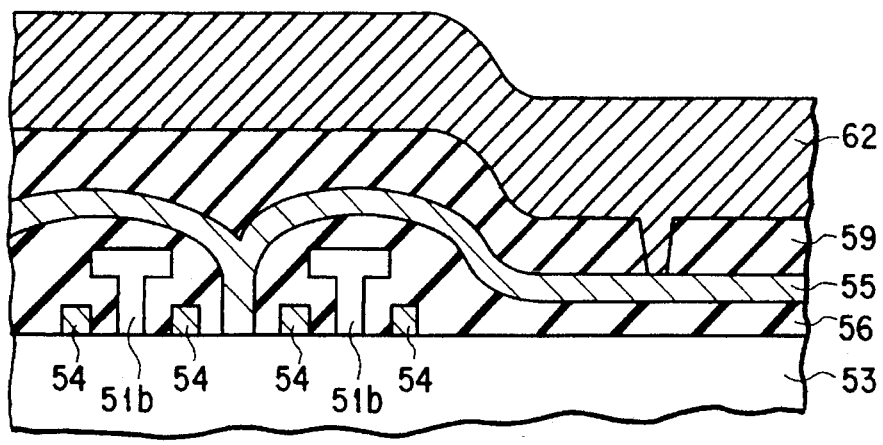

After having formed holes for contacts connected to the bit lines 55 in the dioxide silicon film 59 of the peripheral circuit portion 52 (holes being similarly formed for contacts connected to the word lines 54 between the memory array regions 51a of the memory cell portion 51), an inter-level insulating film 62 is deposited uniformly on the dioxide silicon film 59 (FIG. 9A).

Figure 9B:
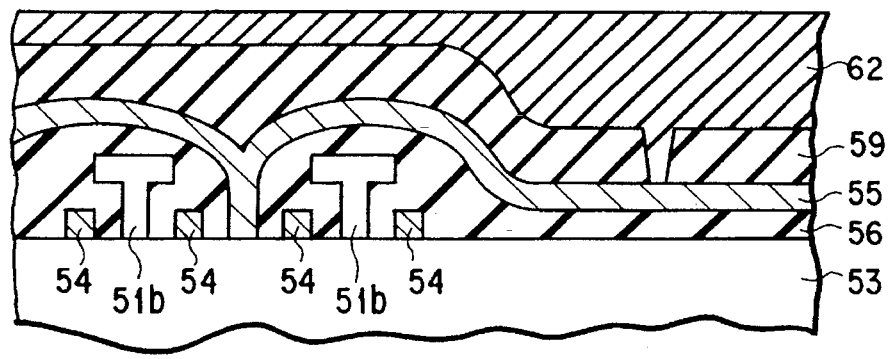

The upper surface of the inter-layer insulating film 62 is gradually removed by a surface polishing method so as to obtain a plane at the same level (FIG. 9B).

Figure 9C:
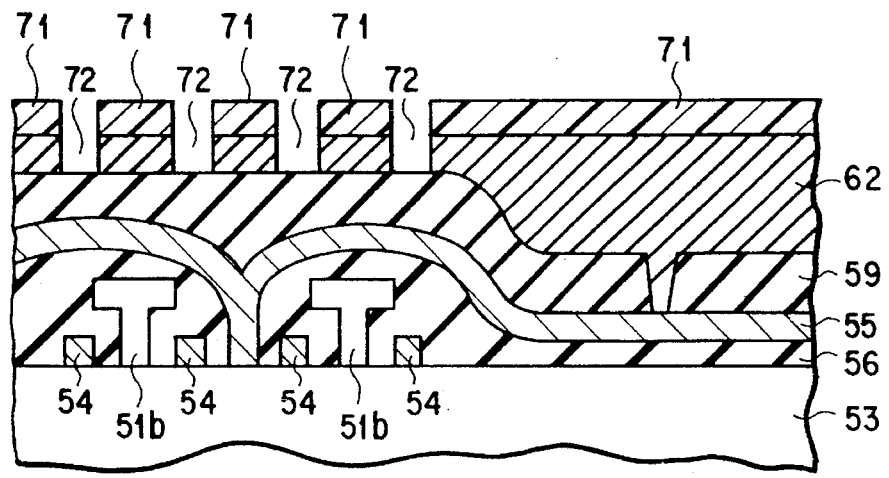

Thereafter, a resist film 71 is patterned by lithography and anisotropic etching is performed using the resist film 71 as a mask. Thus, first grooves 72 in which metal wirings for shunting the word lines 54 are formed at the memory cell portion 51 so as to pass through the inter-layer insulating film 62 (FIG. 9C).

After removal of the resist film 71, another resist film 73 is formed and patterned and anisotropic etching is performed using the resist film 73 as a mask. Second grooves 74 in which metal wirings connected to the bit lines 55 are embedded and which are deeper than the first grooves 72 are formed at the peripheral circuit portion 52 so as to pass through the inter-level insulating film 62 (FIG. 9D).

Thereafter, the resist film 73 is removed, and a conductive film made of a material such as aluminum having a small wire resistance is uniformly deposited on the inter-level insulating film 62.

In this case, a metallic material such as aluminum is deposited by spattering of the like and is embedded in the holes 60 and 61 to form contacts in the holes 60 and 61.

The conductive film deposited on the inter-level insulating film 62 is gradually removed by a surface polishing method, for example, and is processed to obtain an upper surface at a predetermined level.

in this way, the metal wiring 57 for shunting the word lines 54 of the memory cell portion 51 and the metal wiring 58 of the peripheral circuit portion 58 are embedded in the grooves 72 and 74, respectively (FIG. 9E).

When the metal wirings 57 and 58 having their upper surfaces at the same level are formed, there are performed deposition and flattening of the inter-level insulating film 62, formation of holes for the contacts connected to the upper-level wiring film 63, formation of contact holes 64 and 65 due to deposition of metallic material, patterning of the upper-level wiring film 63 and formation of the passivation film 66 in a similar manner. Then, a DRAM as shown in FIGS. 6, 7A and 7B is manufactured.

In this embodiment, the upper surfaces of the metal wirings 57 and 58 are also at the same level. Thus, the surfaces of the inter-level insulating film 62 can be flattened easily, and the depths of the contacts connected to the upper-level wiring film 63 can be made equal. As a result, the upper-level wiring film 63 can be patterned easily and the contact holes 64 and 65 can be formed easily.

The shunting metal wiring 57 thinner than the metal wiring 58 at the peripheral circuit portion 52 is formed at the memory cell portion 51, and the metal wiring 58 thicker than the shunting metal wiring 57 at the memory cell portion 51 is formed at the peripheral circuit portion 52. Thus, the device characteristics can be optimized.

In the fifth embodiment, grooves having different depths are formed in the inter-level insulating film having a flattened surface. Although the film thicknesses of the metal wiring are locally varied to optimize the device characteristics, the upper surfaces of the metal wirings can be made flush with each other by embedding the metal wired in the grooves.

Similarly to the case of the fourth embodiment, the upper film wiring can be patterned easily and the contact holes can be formed easily when a multi-level wiring is provided.

In the fifth embodiment, the metal wirings are not always embedded simultaneously by the same process but can be done by separate processes. In other words, after a first group of metal wirings have been embedded in the first grooves, the second grooves may formed and the remaining metal wirings may be embedded in the second grooves.

The present invention is applicable not only to a DRAM but also to other semiconductor devices each having a stack type structure.

The present invention provides a semiconductor device and a method of manufacturing such a semiconductor device, which does not require added unnecessary processes, simply prevents a semiconductor substrate from being etched and avoids change of the element characteristics easily.

The present invention further provides a semiconductor device and a method of manufacturing the semiconductor device which is suited for forming a multi-layer wiring thereon by making the upper surface of the conductor flat although the thickness of the conductor is varied.

Various modifications are possible to the present invention without changing the scope of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising:

a step of forming a step portion on a semiconductor substrate;

a step of forming an insulating film along said step portion over said semiconductor substrate;

a step of polishing and flattening an upper surface of said insulating film;

a step of forming first grooves in said upper surface of said insulating film, said first grooves being characterized by a first depth;

a step of forming second grooves in said upper surface of said insulating film, said second grooves being characterized by a second depth, said first depth being unequal to said second depth;

a step of depositing a conductive film on said insulating film in which said first and second grooves are formed; and a step of polishing an upper surface of said conductive film to remove first portions of said conductive film while leaving second portions of said conductive film, said second portions corresponding to said grooves to thereby form conductors in said grooves.

2. The method of manufacturing a semiconductor device according to claim 1, wherein said step portion comprises a memory cell array region.

3. The method of manufacturing a semiconductor device according to claim 1, wherein said conductors formed in said grooves comprise wirings for shunting word lines.

4. The method of manufacturing a semiconductor device according to claim 1, wherein said conductors formed in said grooves comprise wirings for memory peripheral circuits.

5. A method of manufacturing a semiconductor device comprising:

a step of forming a memory cell array region on a semiconductor substrate to provide a step portion on said semiconductor substrate;

a step of forming an insulating film along said step portion over said semiconductor substrate;

a step of polishing and flattening an upper surface of said insulating film;

a step of forming first grooves in said upper surface of said insulating film, said first grooves being characterized by a first depth:

a step of forming second grooves in said upper surface of said insulating film said second grooves being characterized by a second depth, said first depth being unequal to said second depth;

a step of depositing a conductive film on said insulating film; and a step of polishing an upper surface of said conductive film to remove first portions of said conductive film while leaving second portions of said conductive film, said second portions corresponding to said first and second grooves to thereby form conductive layers in said first and second grooves.

6. The method of manufacturing a semiconductor device according to claim 1, wherein, first grooves are formed on said step portion and are used to form a wiring for shunting memory word lines, and second grooves are formed on said semiconductor substrate and are used to form a wiring for a memory peripheral circuit portion.

7. A method of manufacturing a semiconductor device comprising:

a step of forming a memory cell array region on a semiconductor substrate to provide a step portion on said semiconductor substrate;

a step of forming an insulating film along said step portion over said semiconductor substrate;

a step of polishing and flattening an upper surface of said insulating film;

a step of forming first grooves in said upper surface of said insulating film, said first grooves being characterized by a first depth;

a step of forming second grooves in said upper surface of said insulating film, said second grooves being characterized by a second depth, said first depth being unequal to said second depth;

a step of depositing a conductive film over said insulating film in which said first and second grooves are formed; and a step of polishing an upper surface of said conductive film to remove first portions of said conductive film while leaving second portions of said conductive film, said second portions corresponding to said first and second grooves to thereby form conductive layers in said first and second grooves, and wherein said first grooves are formed at said step portion so as to receive a wiring for shunting memory word lines and said second grooves are formed at a portion of said semiconductor substrate which is other than said step portion so as to receive a wiring for said memory peripheral circuit.

8. A method of manufacturing a semiconductor device comprising:

a step of forming a memory cell array region on a semiconductor substrate to provide a step portion on said semiconductor substrate;

a step of forming an insulating film along said step portion over said semiconductor substrate;

a step of polishing and flattening an upper surface of said insulating film;

a step of forming first grooves in a first part of said upper surface of said insulating film, said first grooves being characterized by a first depth;

a step of depositing a conductive film on said first part of said upper surface of said insulating film in which said first grooves are formed;

a step of polishing a surface of said conductive film to form a wiring for shunting memory word lines in said first grooves;

a step of forming second grooves over a second part of said semiconductor substrate, said second grooves being characterized by a second depth, said first depth being unequal to said second depth;

a step of depositing a conductive layer on said insulating film in which said second grooves are formed; and a step of polishing an upper surface of said conductive layer deposited on said insulating film to form a wiring for a memory peripheral circuit in said second grooves.

* * * * *

UNITED STATES PATENT AND TRADEMARK OFFICE
CERTIFICATE OF CORRECTION

PATENT NO.   : 5,602,050
DATED        : February 11, 1997
INVENTOR(S)  : Akira Sudo It is certified that error appears in the above-indentified patent and that said Letters Patent is hereby corrected as shown below:

In Item [30] Foreign Application Priority Data on the first page of the patent, please change "Apr. 6, 1994 [JP] Japan .....6-086365" to --Apr. 6, 1994 [JP] Japan .....6-068365--.

Signed and Sealed this

Seventeenth Day of June, 1997

Attest:

BRUCE LEHMAN

*Attesting Officer*          *Commissioner of Patents and Trademarks*